United States Patent
Noguchi et al.

(10) Patent No.: US 10,042,725 B2
(45) Date of Patent: Aug. 7, 2018

(54) MEMORY CONTROL CIRCUIT, CACHE MEMORY AND MEMORY CONTROL METHOD

(71) Applicant: KABUSHIKI KAISHA TOSHIBA, Tokyo (JP)

(72) Inventors: Hiroki Noguchi, Kanagawa (JP); Shinobu Fujita, Tokyo (JP); Keiko Abe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 15/059,702

(22) Filed: Mar. 3, 2016

(65) Prior Publication Data
US 2016/0188429 A1 Jun. 30, 2016

Related U.S. Application Data

(63) Continuation of application No. PCT/JP2014/073683, filed on Sep. 8, 2014.

(30) Foreign Application Priority Data

Sep. 6, 2013 (JP) .................................. 2013-185676

(51) Int. Cl.
*G06F 11/20* (2006.01)
*G06F 12/16* (2006.01)
(Continued)

(52) U.S. Cl.
CPC ...... *G06F 11/2069* (2013.01); *G06F 11/1004* (2013.01); *G06F 11/1068* (2013.01);
(Continued)

(58) Field of Classification Search
CPC ............ G06F 11/2069; G06F 11/1004; G06F 11/1068; G06F 12/0802; G06F 12/16;
(Continued)

(56) References Cited

U.S. PATENT DOCUMENTS 7,430,693 B2 * 9/2008 Noguchi ............. G06F 11/1048
714/710
7,624,324 B2 11/2009 Hanaoka et al.
(Continued)

FOREIGN PATENT DOCUMENTS

JP H05-165719 7/1993
JP H10-240628 9/1998
(Continued)

OTHER PUBLICATIONS

International Search Report from the Japanese Patent Office in International Application No. PCT/JP2014/073683, dated Oct. 7, 2014, 1 page.

(Continued)

*Primary Examiner* — John J Tabone, Jr.
(74) *Attorney, Agent, or Firm* — Finnegan, Henderson, Farabow, Garrett & Dunner, L.L.P.

(57) ABSTRACT

A memory control circuit has an error determination circuitry to determine whether an error-bit number is larger than a predetermined threshold value set based on a maximum number of error bits correctable by the error correction circuitry, when it is detected by the error detector that an error is contained in data read for verification of data written to the first memory or in data read from the first memory, and an access controller to control access to a second memory having an access priority lower than the first memory when it is determined that the error-bit number is larger than the threshold value, and to control access to the first memory without accessing the second memory when it is determined that the error-bit number is equal to or less than the threshold value.

10 Claims, 5 Drawing Sheets

(51) Int. Cl.
  *G11C 29/52* (2006.01)
  *G11C 11/16* (2006.01)
  *G06F 12/0802* (2016.01)
  *G06F 11/10* (2006.01)
  *G11C 29/04* (2006.01)

(52) U.S. Cl.
  CPC .......... *G06F 12/0802* (2013.01); *G06F 12/16* (2013.01); *G11C 11/1677* (2013.01); *G11C 29/52* (2013.01); *G11C 2029/0411* (2013.01)

(58) Field of Classification Search
  CPC ................ G11C 11/1677; G11C 29/52; G11C 2029/041
  USPC ..... 714/763, 768, 769, 773, 782, 6.21, 6.24, 714/42, 54; 711/104, 113, 118, 119, 120, 711/123, 125, 126, 143, 144; 365/158, 365/200, 201, 208, 185.09
  See application file for complete search history.

(56) References Cited

U.S. PATENT DOCUMENTS

| | | | | |
|---|---|---|---|---|
| 7,773,022 B2* | 8/2010 | Cornwell | ................. | G11C 7/16 341/156 |
| 7,872,909 B2* | 1/2011 | Song | ................... | G11C 11/5642 365/185.02 |
| 7,949,911 B2* | 5/2011 | Tseng | ............... | G11C 29/56008 365/201 |
| 8,286,053 B2 | 10/2012 | Hirano | | |
| 8,386,860 B2* | 2/2013 | Tseng | ................. | G11C 16/3418 714/721 |
| 8,640,005 B2* | 1/2014 | Wilkerson | .......... | G06F 11/1064 714/763 |
| 8,706,950 B2 | 4/2014 | Yano et al. | | |
| 8,806,301 B2* | 8/2014 | Yu | ........................ | G06F 11/1072 714/773 |
| 2005/0204212 A1* | 9/2005 | Noguchi | ............. | G06F 11/1048 714/710 |
| 2007/0263439 A1* | 11/2007 | Cornwell | ............ | G11C 11/5628 365/185.03 |
| 2007/0263441 A1* | 11/2007 | Cornwell | ............ | G06F 11/1068 365/185.03 |
| 2007/0263442 A1* | 11/2007 | Cornwell | ................. | G11C 5/04 365/185.03 |
| 2007/0263469 A1* | 11/2007 | Cornwell | ................ | G11C 5/145 365/226 |
| 2007/0277060 A1* | 11/2007 | Cornwell | ............ | G11C 11/5628 714/54 |
| 2008/0172523 A1 | 7/2008 | Tanaka et al. | | |
| 2009/0207659 A1* | 8/2009 | Song | ................... | G11C 11/5642 365/185.03 |
| 2009/0276680 A1* | 11/2009 | Chiu | .................... | G06F 11/1068 714/752 |
| 2010/0122129 A1* | 5/2010 | Tseng | ..................... | G11C 29/56 714/719 |
| 2010/0185904 A1* | 7/2010 | Chen | ..................... | G06F 11/073 714/54 |
| 2011/0087950 A1* | 4/2011 | Yu | ........................ | G06F 11/1072 714/773 |
| 2011/0258495 A1* | 10/2011 | Tseng | ................. | G11C 16/3418 714/704 |
| 2012/0117428 A1 | 5/2012 | Fukuda | | |
| 2012/0163097 A1 | 6/2012 | Ishikawa et al. | | |
| 2012/0317463 A1* | 12/2012 | Sugahara | ............ | G06F 11/1048 714/785 |
| 2013/0139007 A1 | 5/2013 | Higo et al. | | |
| 2014/0149827 A1* | 5/2014 | Kim | .................... | G06F 11/1064 714/764 |
| 2014/0164875 A1* | 6/2014 | Kim | .................... | G06F 11/1012 714/764 |
| 2017/0192721 A1* | 7/2017 | Chung | ................. | G06F 3/0659 |

FOREIGN PATENT DOCUMENTS

| | | |
|---|---|---|
| JP | 3931757 | 6/2007 |
| JP | 2008-171163 | 7/2008 |
| JP | 4155052 | 9/2008 |
| JP | 2009-217603 | 9/2009 |
| JP | 4391954 | 12/2009 |
| JP | 4791525 | 10/2011 |
| JP | 2012-103826 | 5/2012 |
| JP | 2012-133642 | 7/2012 |
| JP | 2013-114441 | 6/2013 |

OTHER PUBLICATIONS

Written Opinion of the International Searching Authority dated Mar. 17, 2016, attached to the International Preliminary Examination Report on Patentability in International Application No. PCT/JP2014/073683 dated Mar. 8, 2016, 8 pages.

\* cited by examiner

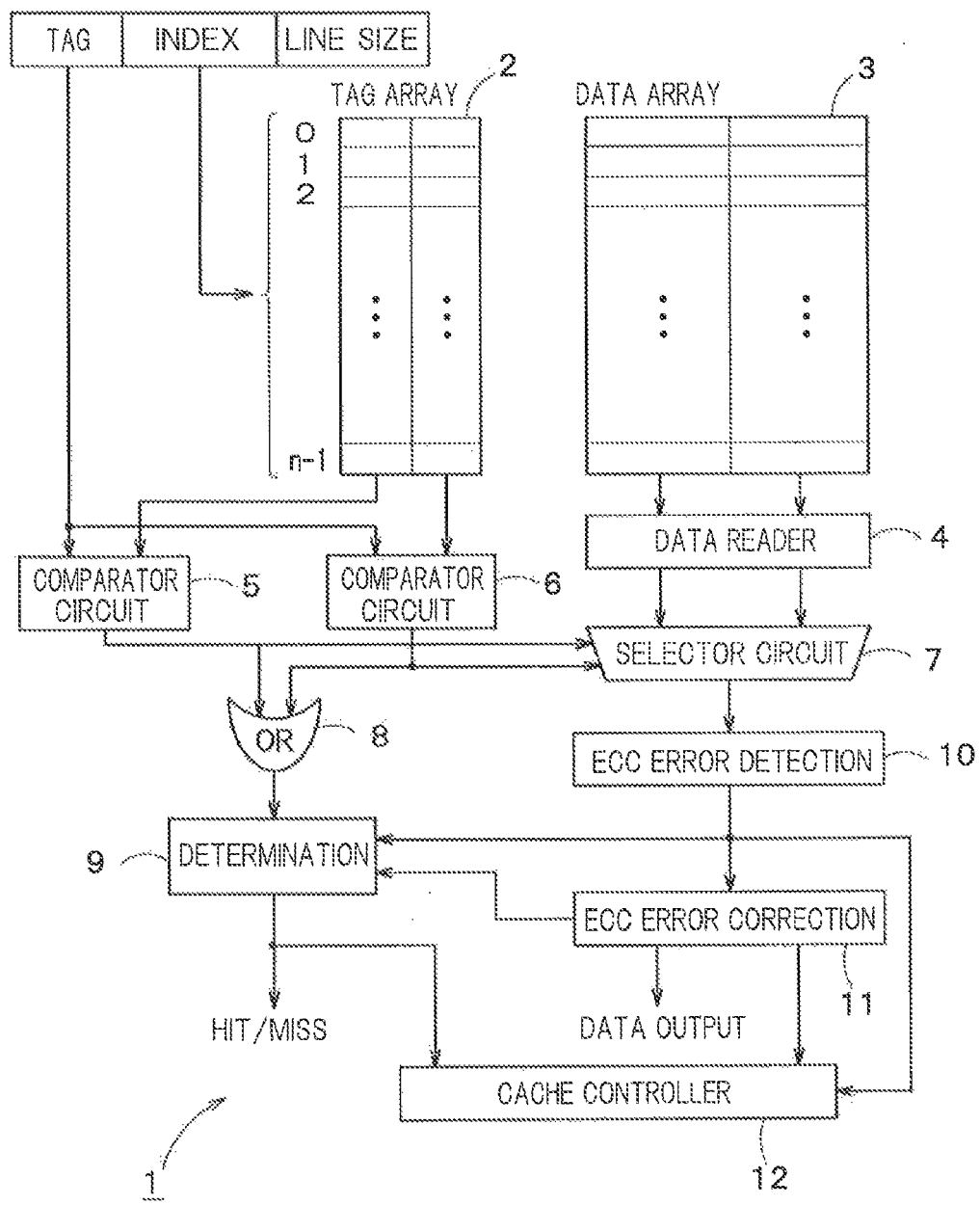
F I G. 1

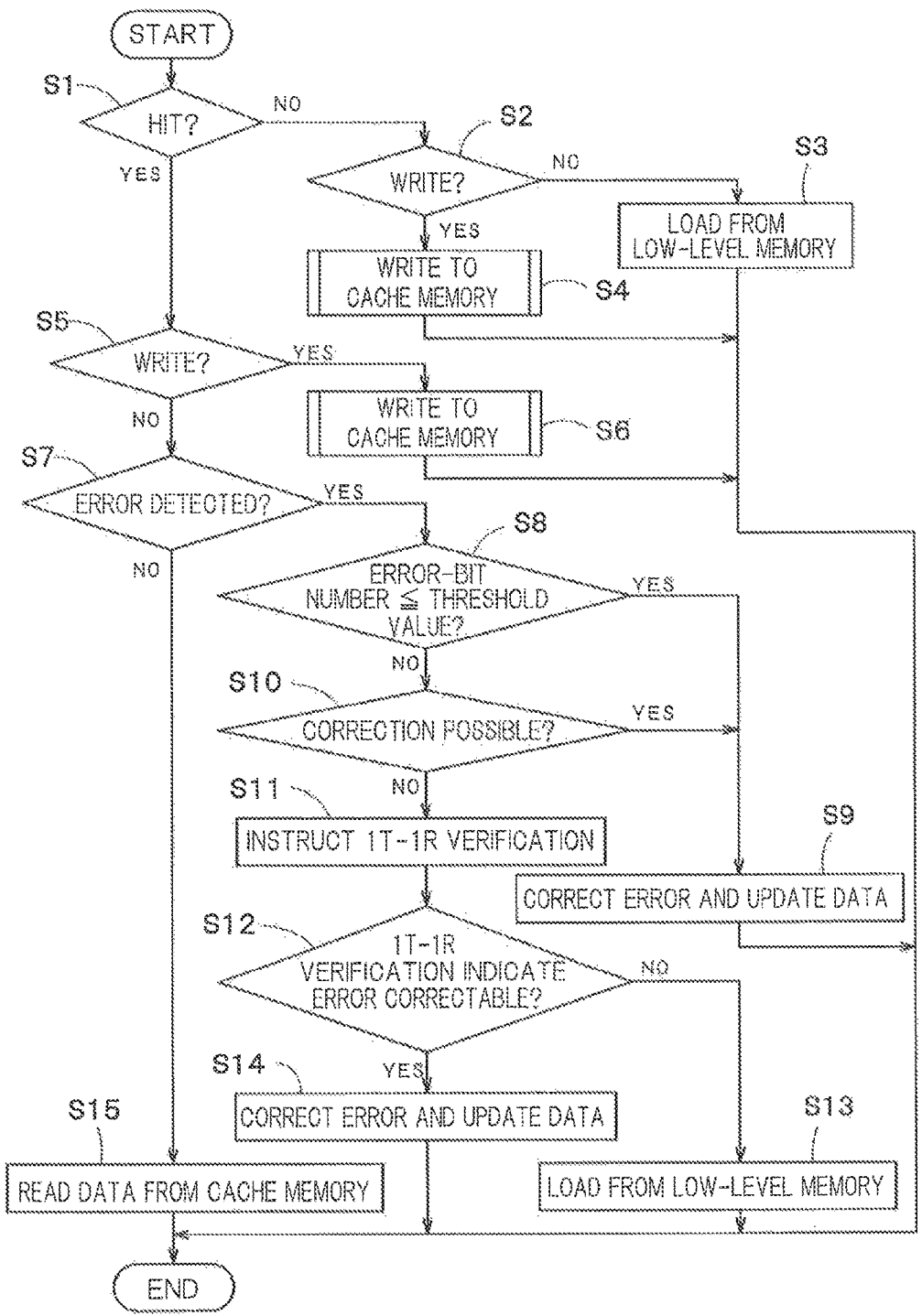
F I G. 4

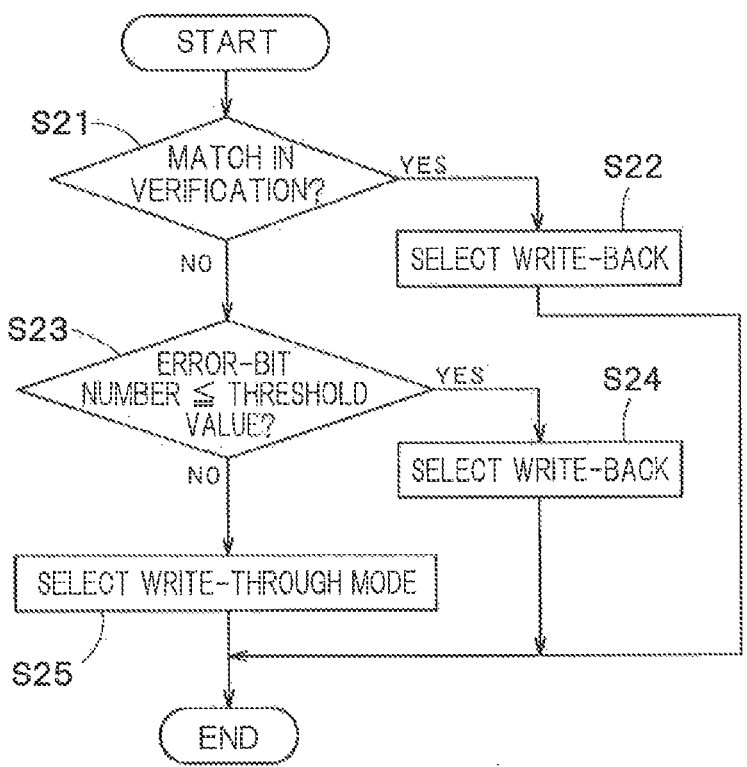
F I G. 5 ically unreliable in writing and data retention."># MEMORY CONTROL CIRCUIT, CACHE MEMORY AND MEMORY CONTROL METHOD

CROSS REFERENCE TO RELATED APPLICATIONS

This application is based upon and claims the benefit of priority from the prior Japanese Patent Application No. 2013-185676, filed on Sep. 6, 2013, the entire contents of which are incorporated herein by reference.

FIELD

Embodiments of the present invention relate to a memory control circuit for controlling a cache memory, a cache memory having a built-in memory control circuit and a method control method.

BACKGROUND

Processors for use in portable information terminals are required to consume lower power. As one of low power technology of the processors, there has been proposed a technique in which a cache memory of SRAMs (Static Random Access Memories) having large stand-by power is replaced with a non-volatile memory having non-volatile elements. For example, MRAMs (Magnetoresistive RAMs) are a memory having three advantages of high rewritability, high-speed read and write performance, and a cell area that allows high integration, among non-volatile memories currently proposed. The MRAMs are excellent in speed compared to other non-volatile memories and also excellent in area efficiency compared to conventional memories. Since the MRAMs can have a larger capacity, the MRAMs are expected to be built in a processor, as a cache memory.

However, compared with the conventional SRAM cache memories, the MRAMs that are thought to operate at high speeds are definitely unreliable in writing and data retention. Moreover, the MRAMs become more unreliable in data retention as a data retention period, required in view of power shut down, lasts several seconds or more.

In order to use the MRAMs as a cache memory, it is required to incorporate an ECC (Error Check and Correct) error correction mechanism for correction of errors due to variation in MRAM devices. However, ECC error correction processing requires ECC incorporation that matches the characteristics of a cache memory, due to large overhead of area and latency.

Initial failure, write failure, retention failure and read failure are four MRAM error factors. When the initial failure originated from device fabrication occurs, data has to be definitely corrected by the ECC. However, the error correction process by the ECC has large area overhead and latency overhead. A redundant bit has to be added to deal with a runtime error.

When an uncorrectable error occurs in the ECC process in the cache memory, irrespective of having the MRAMs, the ECC process is terminated as a fatal error, and thus the running program has to be restarted.

BRIEF DESCRIPTION OF DRAWINGS

FIG. 1 is a block diagram schematically showing the configuration of a cache memory 1 according to an embodiment;

FIG. 4 is a flow chart showing an example of the operation of a cache controller 12; and FIG. 5 is a flow chart showing an example of the detailed procedure of Step S4.

DETAILED DESCRIPTION

Figure 2A:
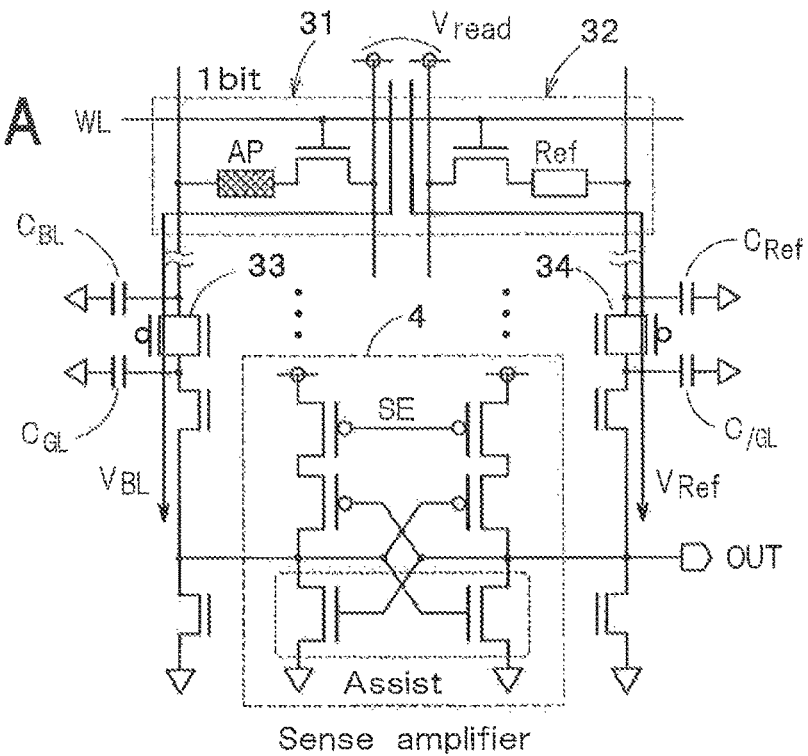
FIG. 2A is a circuit diagram showing an example of a 1T-1R type and FIG. 2B is a circuit diagram showing an example of a 2T-2R type.

According to the present invention, memory control circuit has an error detector to detect whether an error is contained in data written in a first memory or data read from the first memory, an error correction circuitry to correct the error detected by the error detector, an error determination circuitry to determine whether an error-bit number is larger than a predetermined threshold value set based on a maximum number of error bits correctable by the error correction circuitry, when it is detected by the error detector that an error is contained in data read for verification of data written to the first memory or in data read from the first memory, and an access controller to control access to a second memory having an access priority lower than the first memory when it is determined that the error-bit number is larger than the threshold value, and to control access to the first memory without accessing the second memory when it is determined that the error-bit number is equal to or less than the threshold value.

Hereinafter, embodiments of the present invention will be explained with reference to the drawings. FIG. 1 is a block diagram schematically showing schematic configuration of a cache memory 1 according to an embodiment. The cache memory 1 of FIG. 1 is provided with a tag array 2, a data array (first memory) 3, a data reader 4, a first comparator circuit 5, a second comparator circuit 6, a selector circuit 7, a tag matching signal generator 8, a hit determination circuitry 9, an ECC error detector 10, an ECC error correction circuitry 11, and a cache controller 12. In the cache memory 1 of FIG. 1, at least the ECC error detector 10, the ECC error correction circuitry 11, and the cache controller 12 correspond to a memory control circuit.

The tag array 2 stores an address corresponding to each data stored in the data array 3. The tag array 2 is required to have high reliability because it is accessed more frequently than the data array 3. Therefore, a predetermined number of ECC bits are added to a bit string of each address stored in the tag array 2. The number of correctable error bits can be increased as the number of the ECC bits is increased.

In terms of the tag array 2, the ECC error detector 10 and the ECC error correction circuitry 11 are omitted from FIG. 1. However, when ECC bits are added to the bit string of each address in the tag array 2, an ECC error detector and an ECC error correction circuitry are required for the tag array 2.

The data array 3 is set associative to store data using a plurality of ways. The bit string of each data has granularity (for example, 512-bit width) for each way. ECC bits are added to this bit string.

In ECC, for example, BCH codes using hamming codes or the like can be used. When the BCH codes are used, the ECC reliability depends on the number of added bits for ECC. In ECC operations, XOR (exclusive logical sum) is only used. In the case where each way has 512 bits, data is divided into four pieces of data in unit of 128 bits and, for example, 14 ECC bits are added to a 128-bit bit string. In this case, it is determined that there is no error if there is no bit error in a bit string of data bits and ECC bits. If there is only one bit error, the bit error can be detected and also it can be determined which bit has an error. In this case, an error can be corrected by inverting the error bit. If there are two bit errors, although the errors can be detected, it cannot be determined which bits have an error, and hence error correction is impossible. Moreover, if there are three or more bit errors, even the occurrence of errors cannot be correctly recognized, and thus erroneous' information is inevitably returned to a processor.

The certainty of ECC error occurrence can be changed by increasing or decreasing the number of ECC bits or by changing the number of data bits.

The data reader 4 of FIG. 1, as described later, selects a bit line connected to a memory cell to be read, from among a plurality of bit lines of the data array 3, and then senses a voltage of the selected bit line.

Each of the first comparator circuit 5 and the second comparator circuit 6 compares tag bits, which are the upper bit string of an address for the access request by the processor, with tag bits stored in the tag array 2. The reason why there are two comparator types, namely, the first comparator circuit 5 and the second comparator circuit 6, is that the tag array 2 is divided into two ways. In other words, comparators are required by the number of ways.

The tag matching signal generator 8 generates a signal indicating a coincidence by both of the first comparator circuit 5 and the second comparator circuit 6 when the coincidence is detected.

When the coincidence is detected by either the first comparator circuit 5 or the second comparator circuit 6, based on the hit address, the selector circuit 7 reads the corresponding data from a specific way in the data array 3.

Using ECC bits contained in the data read by the selector circuit 7, the ECC error detector 10 detects whether there is an error in this data. The ECC error correction circuitry 11 corrects an error detected by the ECC error detector 10. If no error is detected by the ECC error detector 10, the data read from the data array 3 is output as it is, to the processor. There is a difference in latency between the case where data having an error corrected is transferred to the processor and the case where data having no error detected is transferred to the processor.

In the case where the data read from the data array 3 has no errors or a correctable error, the hit determination circuitry 9 generates a signal that indicates the occurrence of a cache hit. In other cases, the hit determination circuitry 9 generates a signal that indicates the occurrence of a cache miss. In other words, the hit determination circuitry 9 determines that there is a cache miss occurred on data having an error uncorrectable by the ECC error correction circuitry 11. In this case, an access request is made to a high-level cache memory 1 or main memory (hereinafter, a high-level memory or second memory) having access priority lower than the cache memory 1.

As described later, the cache controller 12 performs access control to the cache memory 1 and the high-level memory based on the processing results of the ECC error detector 10, the ECC error correction circuitry 11 and the hit determination circuitry 9.

Errors that can be relieved by ECC include an initial error originated in production, in addition to a write error and a retention error. Conventionally, the initial error is relieved by replacement with a redundant cell using a fuse element, with no access to an address block that has the initial error.

However, the initial error mostly occurs in a manner that a bit is fixed to 0 or 1. Therefore, when a bit to be written happens to have the same value as the fixed value, it may be erroneously determined that the bit has a correct value.

The present embodiment is employed to operate the cache memory 1 correctly, without replacement with a redundant cell or without complete correction of the initial error even with replacement with the redundant cell, or even in a condition where a bit error may occur due to aging degradation even if there is no initial error at the beginning.

An operation in data writing is explained first. Right after that data is written, the data is read for write verification to compare the written value and the read value. In the write verification, if there is no error, it is determined that writing is correctly completed, hence no additional processes are performed. If there is a difference between the written value and the read value, it is determined by calculating the number of un-matched bits whether the error is detectable by the ECC error detector 10 and is correctable by the ECC error correction circuitry 11.

It is supposed that there is an error-correctable number of error bits and the number of un-matched bits is larger than a predetermined threshold value. In this case, thereafter, it is highly likely that the error cannot be corrected by ECC. Therefore, the same data is written in a high-level memory for backing up. This is equivalent to a write-through cache operation. In this specification, it is referred to as a write-through mode that, in parallel with writing data in a cache memory, the same data is written in a high-level memory.

The predetermined threshold value is a specific value set based on the maximum number of bits having errors correctable by the ECC error correction circuitry 11. More specifically, the predetermined threshold value is set to be equal to or smaller than the maximum number of bits. By setting the threshold value to be equal to or smaller than the maximum number of bits having correctable errors, the ECC error correction circuitry 11 can always correct the errors, as long as an actual number of error bits does not exceed the threshold value. In other words, as the threshold value is set to be smaller, the margin of error correction becomes larger, which nevertheless causes higher occurrence of write-through data writing to a high-level memory.

It is supposed that there is an error-correctable number of error bits and the number of un-matched bits is equal to or smaller than the predetermined threshold value. In this case, there is a low possibility that the error cannot be corrected. Therefore, data is written in only the corresponding cache memory. This is equivalent to a write-back operation of the cache memory 1. In this specification, it is referred to as a write-back mode that data written in a cache memory is written-back to a high-level memory, thereafter, at a predetermined timing.

In the case where error correction is already impossible, it is predicted that the cache memory 1 does not function as a cache memory. Therefore, data is written again in another way in the data array 3. When the data is written again, the way having the data written in first and the corresponding tag array 2 are put into a disabled state.

An operation in data reading is explained next. The reliability of data once written in the cache memory 1 is lowered with time due to the deterioration of retention characteristics or the like. Therefore, dirty data is written-back to a low-order memory layer, or a high-level memory, depending on how often an error occurs in data reading.

For example, in response to a data read access, error detection is performed for read data. If no error occurs, since the data has a high reliability, the data is not written in a high-level memory at this time. In the case where errors are detected, and the number of the errors is an error-correctable number and is equal to or smaller than the threshold value, the data has a margin of reliability, and hence the data is also not written in a high-level memory at this time. On the contrary, in the case where errors are detected, and the number of the errors is an error-correctable number and is larger than the threshold value, the data has no margin of reliability. In this case, if it is dirty data, or it is data not yet written in a high-level memory, it is written in the high-level memory. Through this process, the dirty data becomes clean data, so that correct data can be acquired by accessing the low-order memory layer (the high-level memory) even if data in the cache memory 1 has an uncorrectable error. Therefore, there is no possibility that the processor system abends.

In the case where there is already an uncorrectable number of errors occurred, since data having the errors cannot be used, an access is made to the low-order memory layer (high-level memory). When the data having an uncorrectable number of errors is dirty data, this means that correct data is lost, and hence the system may abend. However, in the present embodiment, data is written in a high-level memory in the write-through mode when errors occur, the number of which is larger than the threshold value. This results in that error-correctable data exists in the high-level memory, so that there is an extremely low possibility that the processor system abends. When the system often abends, the threshold value is set to a smaller value. More specifically, right after the system installation, since initial degradation is not identified, the threshold value is set to a relatively small value. Thereafter, for the time being, since the processor system is less degraded with time, the threshold value is set to a relatively large value. When the processor system is gradually degraded with time, the threshold value is set to a small value again. Through such control, the cache memory 1 can be stably operated with no effects of initial degradation and aging degradation.

Spin transfer torque (STT) MRAMs are capable of low-voltage operation and high-speed reading and writing, and hence are suitable to be used as the cache memory 1. As a method to read data stored in an STT-MRAM, a known reading method is a 1T-1R type read mode to distinguish between data 0 and 1 by comparing a current flowing through a magnetoresistive effect element (for example, an MTL element) in an MRAM cell and a current flowing through a reference resistor in a reference cell. However, in order to perform higher speed reading, it is preferable to adopt a 2T-2R type read mode with no reference cell used.

In the 2T-2R type, magnetoresistive effect elements in MRAM cells connected to a pair of bit lines, respectively, are set to have high and low resistance values or vice versa. The currents flowing through the magnetoresistive effect elements are compared to each other to distinguish between data 0 and 1.

In the 2T-2R type, with no comparison with a current flowing through a reference cell, the difference between the currents flowing through magnetoresistive effect elements is detected using a bit line pair, hence speed reading higher than in the case of 1T-1R type is achieved.

Each of the 1T-1R and 2T-2R types is categorized into a current read mode to read a current flowing through a bit line and a voltage read mode to read a voltage of a bit line. Hereinbelow, voltage reading with a capacitor provided along a bit line path will be explained as an example.

A circuit of FIG. 2A includes an MRAM cell 31 having a magnetoresistive effect element AP, a reference cell 32 having a reference resistor Ref, a transfer gate 33 provided on a bit line through which a current from the MRAM cell 31 flows, local capacitance $C_{BL}$ coupled to one end of the transfer gate 33, global capacitance $C_{GL}$ coupled to the other end of the transfer gate 33, a transfer gate 34 provided on a reference bit line through which a current from the reference cell 32 flows, local capacitance $C_{Ref}$ coupled to one end of the transfer gate 34, global capacitance $C_{/GL}$ coupled to the other end of the transfer gate 34, and a sense amplifier 4 connected to the bit line and the reference bit line.

Figure 2B:
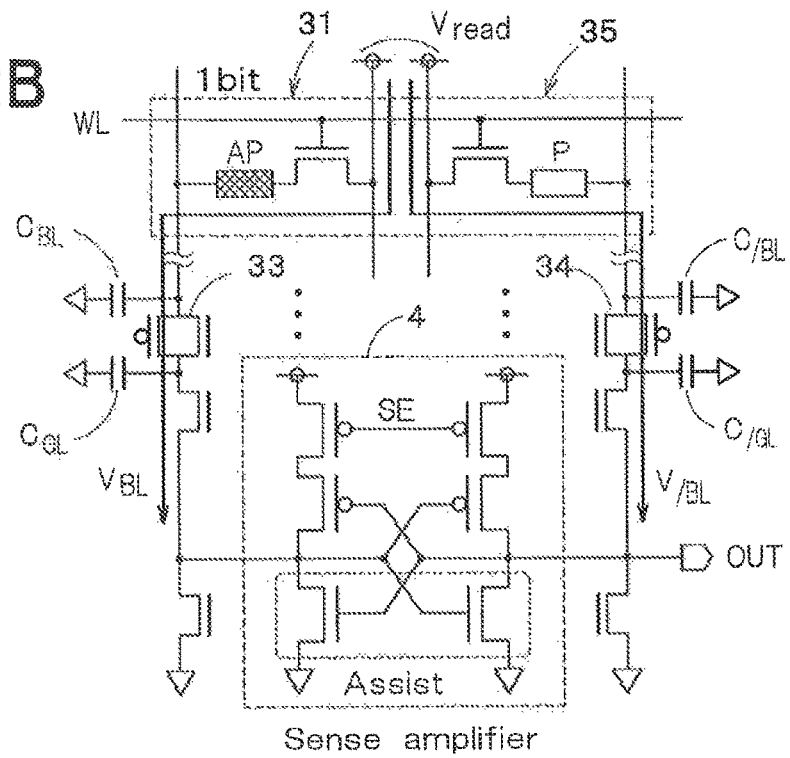

A circuit of FIG. 2B includes a pair of MRAM cells 31 and 35 respectively having magnetoresistive effect elements AP and P having different resistance values, a pair of transfer gates 33 and 34 respectively provided on a pair of bit lines through which currents from the MRAM cells 31 and 35 flow respectively, local capacitance $C_{BL}$ and $C_{/BL}$ coupled to the pair of transfer gates 33 and 34 respectively at one end of each gate, global capacitance $C_{GL}$ and $C_{/GL}$ coupled to the pair of transfer gates 33 and 34 respectively at the other end of each gate, and a sense amplifier 4 connected to the bit line pair.

In the 1T-1R type of FIG. 2A, a voltage at one end of a capacitor that is a composite of the local and global capacitance $C_{BL}$ and $C_{GL}$ storing charges in accordance with a current flowing through the magnetoresistive effect element AP in the MRAM cell 31 is compared to a voltage at one end of a capacitor that is a composite of the local and global capacitance $C_{Ref}$ and $C_{/GL}$ storing charges in accordance with a current flowing through the reference resistor Ref in the reference cell 32 to determine data 0 and 1. The reference resistor Ref has a resistance value between a high and a low resistance value that can be taken by the magnetoresistive effect element AP. Therefore, the data 0 or 1 is determined according to whether the resistance value of the magnetoresistive effect element AP is larger or smaller than that of the reference resistor Ref.

In the 2T-2R type of FIG. 2B, the magnetoresistive effect elements AP and P, which are located in the MRAM cells 31 and 35 respectively and are connected to a pair of bit lines respectively, are set to have high and low resistance values or vice versa. A voltage at one end of a capacitor storing charges in accordance with a current flowing through the magnetoresistive effect element AP is compared to a voltage at one end of a capacitor storing charges in accordance with a current flowing through the magnetoresistive effect element P to determine data 0 and 1. As described above, in the 2T-2R type, data is read in a differential manner using a bit line pair, hence speed reading higher than in the case of 1T-1R type is achieved.

In the STT-MRAM, the factors for reducing reliability are variations in write current value, data retention time, etc. of the magnetoresistive effect elements. Errors occur due to the variations. There are practically three major errors which are a write error, a read error and a retention error.

The error that mostly occurs in 2T-2R type cells is an error caused in the case where both of the magnetoresistive effect elements in a pair provided corresponding to a bit line pair become low or high resistive. As described above, in the 2T-2R type read mode, the currents flowing through magnetoresistive effect elements in a pair corresponding to a bit line pair are compared to each other. Therefore, if both of the magnetoresistive effect elements in the pair become low or high resistive, no remarkable difference is shown in the currents flowing through these magnetoresistive effect elements. As a result, it may occur that a slight current difference is sensed and thus erroneous data is output.

In the 1T-1R type read mode described above, the current flowing through a magnetoresistive effect element corresponding to each bit line is compared with the current flowing through the reference resistor in the reference cell. Therefore, even if both of the magnetoresistive effect elements in a pair corresponding to a bit line pair become low or high resistive, an error can be correctly detected by comparison with the reference cell having an intermediate resistance value.

In view of above, the data reader 4 in the present embodiment adopts a new read mode, although based on the 2T-2R type read mode, which is a combination of the 2T-2R type read mode and the 1T-1R type read mode by which comparison with the reference cell can be performed in detection of errors.

Figure 3:
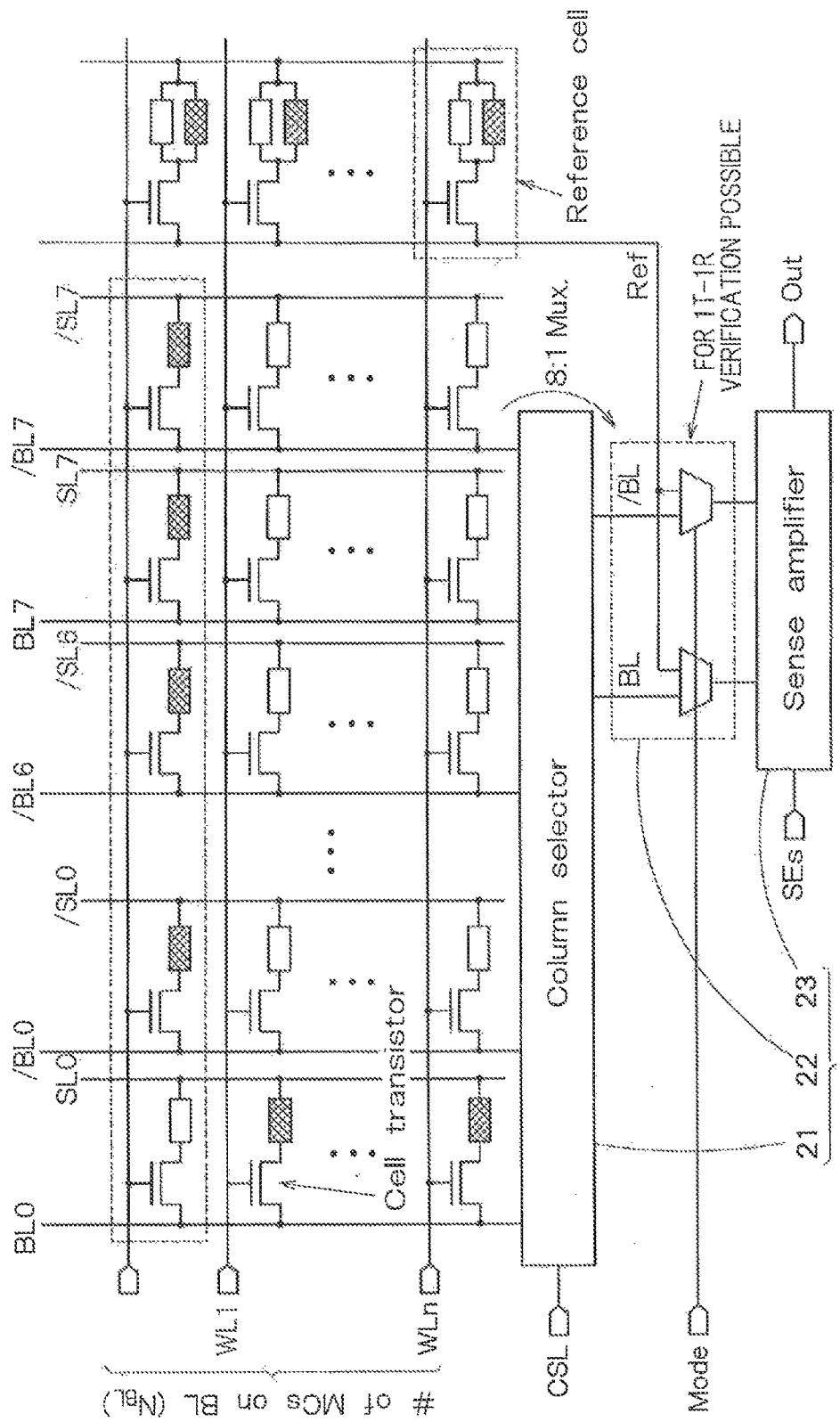
FIG. 3 is a block diagram showing an example of the internal structure of a data reader 4.

FIG. 3 is a block diagram showing an example of the internal structure of the data reader 4. The data reader 4 of FIG. 3 has a column selector 21, a read mode selector 22, and a sense amplifier 23.

Based on a column selection signal CSL output from a column decoder (not shown), the column selector 21 selects a bit line connected to an MRAM cell to be read. Based on a mode selection signal Mode output from the cache controller 12, the read mode selector 22 selects either 2T-2R type reading or 1T-1R type reading.

The cache controller 12, normally, sets a signal logic of the mode selection signal Mode so as to perform the 2T-2R type reading, whereas, when an error is detected, switches the signal logic of the mode selection signal Mode so as to perform the 1T-1R type reading.

FIG. 4 is a flow chart showing an example of the operation of the cache controller 12. The procedure of the flow chart starts when the processor makes an access request to an address.

Firstly, it is determined whether there is a hit in the cache memory 1 with an access-requested address, or there is data of the access-requested address stored in the cache memory 1 (Step S1). If there are no hits, it is determined whether the access request is a write request (Step S2, a first read-write determination circuitry). If it is not a write request, but a read request, data corresponding to the access-requested address is read from a high-level memory and is stored (loaded) in the cache memory 1, and then the data is transferred to the processor (Step S3). If it is a write request, data corresponding to the write-requested address is written in the cache memory 1 (Step S4). In Step S4, verification is performed to the data written in the cache memory 1, and, based on the verification, either the write-through mode or the write-back mode is selected.

FIG. 5 is a flow chart showing an example of the detailed procedure of Step S4. Firstly, the data written in the cache memory 1 is read and it is verified whether the written data and the read data match each other (Step S21).

If there is a match in Step S21, it is determined that there are no errors and then the write-back mode is selected to write the data later in the high-level memory (Step S22). The reason why the write-back mode is selected is that the data written in the cache memory 1 has a margin of reliability with no errors, and hence, in the same manner as an ordinary cache memory 1, the data is allowed to be written in the high-level memory when there are no accesses from the processor.

If it is determined that there are no matches in Step S21, the ECC error detector 10 detects the number of error bits, and it is determined whether the detected number of error bits is equal to or smaller than a predetermined threshold value that is equal to or smaller than the maximum number of error bits correctable by the ECC error correction circuitry 11 (Step S23). If the number of error bits is equal to or smaller than the threshold value, it is determined that there is a margin of reliability, and also in this case, the write-back mode is selected to write the data later in the high-level memory (Step S24).

If it is determined in Step S23 that the number of error bits is larger than the threshold value, it is determined that there is no margin of reliability, and hence the write-through mode is selected to write the data in the high-level memory (Step S25). The reason why the write-through mode is selected is as follows. A large number of error bits at present means that it may occur that the errors are increased and are not be completely corrected due to aging deterioration or the like. Therefore, the data is immediately written in the high-level memory so that correct data can be read from the high-level memory even when the data in the cache memory 1 cannot be read in future.

If it is determined in Step S1 of FIG. 4 that there is a hit in the cache memory 1, it is determined whether the access request made by the processor is a write request (Step S5, a second write determination circuitry). In the case of the write request, in the same manner as the above-described Step S4, data corresponding to the access-requested address is written in the cache memory 1 (Step S6). Also in Step S5, the procedure the same as in FIG. 5 is performed to select either the write-through mode or the write-back mode.

If it is determined in Step S5 that the access request is a read request, data corresponding to the access-requested address is read from the cache memory 1 and it is determined by the ECC error detector 10 whether the read data has errors (Step S7). If it is determined that there are errors, it is determined whether the number of error bits is equal to or smaller than the above-described threshold value (Step S8). If it is determined that the number of error bits is equal to or smaller than the threshold value, error-corrected data is transferred to the processor and the data in the cache memory 1 is updated (Step S9). In Step S9, since it may occur in near future that the errors cannot be corrected due to aging deterioration, if data of this address is not yet written-back to the high-level memory, or if it is dirty data, it is written-back to the high-level memory.

If it is determined in Step S8 that the number of error bits is larger than the threshold value, it is determined whether the error is correctable by the ECC error correction circuitry 11 (Step S10). The threshold value is equal to or smaller than the maximum number of error bits correctable by the ECC error correction circuitry 11. There is a case where, even if an actual number of error bits is larger than the threshold value, an error can be corrected by the ECC error correction circuitry 11. Therefore, it is determined in Step S10 whether the error is correctable. If it is determined that the error is correctable, the procedure moves to the above-described Step S9 to correct the error at the ECC error correction circuitry 11, transfer the corrected data to the processor, and update the data in the cache memory 1.

If it is determined in Step S8 that the error is uncorrectable, the mode selection signal Mode input to the data reader 4 is switched to issue an instruction for error verification in the 1T-1R reading mode (Step S11). Subsequently, the ECC error detector 10 performs error detection to the data which is output in the 1T-1R reading mode performed by the data reader 4. It is determined whether the detected number of error bits is larger than a predetermined threshold value set based on the maximum number of error bits correctable by the ECC error correction circuitry 11 (Step S12). If it is determined that the number of error bits is larger than the predetermined threshold value, it is determined that error correction is impossible, and hence data corresponding to the read-requested address is read from the high-level memory and stored in the cache memory 1 and also transferred to the processor (Sep S13). If it is determined that the number of error bits is equal to or smaller than the predetermined threshold value, the data read from the cache memory 1 is error-corrected by the ECC error correction circuitry 11 and the data in the cache memory 1 is updated, and then the error-corrected data is transferred to the processor (Step S14).

If it is determined that there are no errors in Step S7, error correction is not performed and the data read from the cache memory 1 is transferred to the processor (Step S15).

In the flow chart of FIG. 4, Steps S7, S8 and S11 correspond to an error determination circuitry and Steps S4, S6, S9, S13 and S14 correspond to an access controller.

As described above, according to the present embodiment, when there is a write request from the processor to an address, data written in the cache memory 1 is read therefrom and verification is made to the read data. If the number of error bits is equal to or smaller than the threshold value, it is determined that there is a margin of reliability and thus the write-back mode is selected. If the number of error bits is larger than the threshold value, it is determined that it is highly likely that error correction cannot be performed and thus the write-through mode is selected to write the data written in the cache memory 1 in the high-level memory. Moreover, when there is a write request from the processor to an address, error detection is performed to data read from the cache memory 1. If the number of error bits is equal to or smaller than the threshold value, error-corrected data is written in the cache memory 1. If the number of error bits is larger than the threshold value, it is determined that error correction is impossible and thus the corresponding data is read from the high-level memory to update the data in the cache memory 1.

For data stored in the cache memory 1, errors occur more easily due to aging deterioration as the data is stored for a longer time period. Therefore, like DRAM refreshing, it is preferable to periodically read data from the cache memory 1 and rewrite the data. Data to be periodically read are preferably all data, however, may be part of the data. In this process, like the process of FIG. 4, it may be performed that an error is detected and the number of error bits is compared with the threshold value, and then, based on the comparison result, the mode is switched to the write-through mode as required. With these processes, writing to the high-level memory can be performed before it becomes impossible to read data perfectly from the cache memory 1 due to increase in errors caused by aging degradation, thereby improving access reliability to the cache memory 1.

As described above, according to the present embodiment, even in the case where errors are contained in data written in or read from the cache memory 1, if the errors can be corrected with a large margin, the data from the cache memory 1 is handled as valid data, and hence the access frequency to the high-level memory is reduced to achieve high-speed accessing.

Moreover, in the case where the number of error bits contained in data written in the cache memory 1 is larger than the threshold value that is smaller than the maximum number of error bits correctable by the ECC (error correction circuitry) 11, the data in the cache memory 1 is also stored in the high-level memory. Therefore, problems such as malfunctions due to data errors in the cache memory 1 can be prevented, and hence reliability is improved.

Moreover, in the present embodiment, there is a case where MRAM cells are used as the memory cells of the cache memory 1. In this case, even if both of the magnetoresistive effect elements in a pair connected to a bit line pair have an error to become low or high resistive, by comparing the resistance value of each magnetoresistive effect element with that of the reference resistor in the reference cell, it is correctly detected which magnetoresistive effect element has an error.

The present invention is not limited to the embodiments described above but includes various modifications conceivable by those skilled in the art. The effects of the present invention are also not limited to those described above. Namely, various additions, modifications and partial omissions may be made without departing from the conceptual idea and gist of present invention derived from those defined in the accompanying claims and their equivalents.

The invention claimed is:

1. A memory control circuit comprising:
   an error detector to detect whether an error is contained in data written in a first memory or data read from the first memory;
   error correction circuitry to correct the error detected by the error detector;
   first error determination circuitry to determine whether an error-bit number is larger than a first threshold value set based on a number less than a maximum number of error bits correctable by the error correction circuitry, when it is detected by the error detector that the error is contained in data read for verification of data written to the first memory or in data read from the first memory;
   second error determination circuitry to determine whether the error-bit number is larger than a second threshold value set based on the maximum number of error bits, when it is determined that the error-bit number is larger than the first threshold value by the first error determination circuitry; and
   an access controller to control whether data stored in the first memory is written to a second memory being accessed by a processor in lower priority than the first memory or the error correction circuitry corrects the error, based on results determined by the first error determination circuitry and the second error determination circuitry.

2. The memory control circuit of claim 1, wherein the error determination circuitry reads data to verify the data when the data is written to the first memory, and determines whether the error-bit number is larger than the threshold value when it is detected by the error detector that the error is contained in the read data, and
   when it is determined that the error-bit number is larger than the threshold value, the access controller writes data to be written in the first memory to the second memory in a write-through mode.

3. The memory control circuit of claim 1, wherein the error determination circuitry determines whether the error-bit number is larger than the threshold value when it is detected by the error detector that the error is contained in data read from the first memory, and
   when it is determined that the error-bit number is larger than the threshold value, and if the read data in the first memory is not written to the second memory, the access controller writes the data to the second memory.

4. The memory control circuit of claim 1, wherein the threshold value is a value equal to or smaller than the maximum number of error bits.

5. The memory control circuit of claim 1, wherein the error detector periodically detects whether the error is contained in a memory cell in the first memory, and,
for the memory cell in the first memory, the access controller periodically operates the error detector, the error correction circuitry, and the error determination circuitry, to control whether to write data stored in the first memory to the second memory.

6. A cache memory comprising:
a first memory that stores data;
an error detector to detect whether an error is contained in data written in the first memory or data read from the first memory;
error correction circuitry to correct the error detected by the error detector;
error determination circuitry to determine whether an error-bit number is larger than a predetermined threshold value set based on a maximum number of error bits correctable by the error correction circuitry, when it is detected by the error detector that the error is contained in data read for verification of data written to the first memory or in data read from the first memory; and
an access controller to control whether data stored in the first memory is written to a second memory being accessed by a processor in lower priority than the first memory or the error correction circuitry corrects the error, based on results determined by the error determination circuitry,
wherein the first memory comprises:
a plurality of MRAM (Magnetoresistive RAM) cells, each of which including a magnetoresistive element for data storage, and switchably capable of having a first resistance or a second resistance different from each other;
a reference cell having a resistance value between the first resistance value and the second resistance value; and
a data reader to determine a logic value of data read from the first memory based on a voltage difference between bit lines in a pair which are connected to a pair of the MRAM cells and in which a differential signal flows, when no error is detected by the error detector or when the error-bit number detected by the error detector is equal to or smaller than the threshold value, and determine the logic value of the data read from the first memory based on a result of comparison with the reference cell for each of the bit lines when the error-bit number detected by the error detector is larger than the threshold value,
wherein the error correction circuitry corrects the error based on data determined by the data reader based on the result of comparison with the reference cell for each of the bit lines when the error-bit number is larger than the threshold value, and
the access controller acquires data from the second memory when error correction by the error correction circuitry is impossible in a case where the error-bit number is larger than the threshold value.

7. A cache memory comprising:
a first memory that stores data;
an error detector to detect whether an error is contained in data written in the first memory or data read from the first memory;
error correction circuitry to correct the error detected by the error detector;
error determination circuitry to determine whether an error-bit number is larger than a predetermined threshold value set based on a maximum number of error bits correctable by the error correction circuitry, when it is detected by the error detector that the error is contained in data read for verification of data written to the first memory or in data read from the first memory;
an access controller to control whether data stored in the first memory is written to a second memory being accessed by a processor in lower priority than the first memory or the error correction circuitry corrects the error, based on results determined by the error determination circuitry;
hit determination circuitry to determine whether data of an access-requested address is stored in the first memory; and
first read-write determination circuitry to determine whether to write data to the first memory or read data, when the hit determination circuitry determines that the data is not stored in the first memory,
wherein, when the first read-write determination circuitry determines to read data, the access controller reads data of the corresponding address from the second memory and writes the data to the first memory, and when the first read-write determination circuitry determines to be write data to the first memory, the access controller writes data to be written to the first memory and reads data written in the first memory for verification, and sets a write-back mode if the error-bit number of the detected error is equal to or smaller than the threshold value, whereas sets a write-through mode to write the data to the first memory and the second memory if the error-bit number is larger than the threshold value.

8. The cache memory of claim 7 further comprising second read-write determination circuitry to determine whether to read data from or write data to the first memory, when the hit determination circuitry determines that the data is stored in the first memory,
wherein, when the second read-write determination circuitry determines to write data to the first memory, the access controller writes data to be written to the first memory and reads data written in the first memory for verification, and sets the write-back mode if the error-bit number of the detected error is equal to or smaller than the threshold value, whereas sets a write-through mode if the error-bit number is larger than the threshold value to write the data to the first memory and the second memory.

9. The cache memory of claim 8, wherein, when the second read-write determination circuitry determines to read data from the first memory, the error determination circuitry reads data of an access-requested address from the first memory to determine whether there are error bits, and determines, when there are error bits, whether the error-bit number of the error bits is equal to or smaller than the threshold value, and
when the error determination circuitry determines that the error-bit number is equal to or smaller than the threshold value, the access controller transfers error-corrected data to the second memory and updates data in the first memory.

10. The cache memory of claim 9, wherein, when it is determined that the error-bit number is larger than the threshold value, the error determination circuitry compares data in each of a plurality of memory cells in the first memory with a reference cell to identify data of a read-requested address and determines whether error correction is possible based on the identified data, and
when it is determined by the error determination circuitry that error correction is impossible, the access controller reads data of the corresponding address from the second memory, whereas, when it is determined that error correction is possible, the error correction circuitry performs error correction based on the identified data.

* * * * *